(12) United States Patent
Sabate et al.

(10) Patent No.: US 6,930,483 B2
(45) Date of Patent: Aug. 16, 2005

(54) METHOD/SYSTEM FOR SWITCHED FREQUENCY RIPPLE REDUCTION IN MRI GRADIENT COILS

(75) Inventors: Juan Antonio Sabate, Gansevoort, NY (US); Robert Louis Steigerwald, Burnt Hills, NY (US); Michael Joseph Schutten, Rotterdam, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/632,283

(22) Filed: Aug. 1, 2003

(65) Prior Publication Data

US 2005/0024056 A1 Feb. 3, 2005

(51) Int. Cl.[7] .................................................. G01V 3/00
(52) U.S. Cl. .......................... 324/322; 324/318; 324/309
(58) Field of Search .................................. 324/318, 322, 324/309, 307; 600/410; 318/811

(56) References Cited

U.S. PATENT DOCUMENTS

| | | | |
|---|---|---|---|
| 5,027,071 A | * | 6/1991 | Hardy et al. ................. 324/309 |
| 5,081,409 A | * | 1/1992 | Goff ........................... 318/811 |
| 5,105,153 A | | 4/1992 | Mueller et al. |
| 5,245,287 A | | 9/1993 | Nowak et al. |
| 5,270,657 A | * | 12/1993 | Wirth et al. ................. 324/322 |
| 5,298,863 A | | 3/1994 | Nowak et al. |
| 5,617,030 A | | 4/1997 | Fischer et al. |
| 5,663,647 A | | 9/1997 | Wirth et al. |
| 5,721,490 A | * | 2/1998 | Takano et al. ............... 324/322 |
| 6,031,746 A | | 2/2000 | Steigerwald et al. |
| 2005/0017695 A1 | * | 1/2005 | Stanley ........................ 323/207 |
| 2005/0017699 A1 | * | 1/2005 | Stanley ........................ 323/282 |
| 2005/0024056 A1 | * | 2/2005 | Sabate et al. ................ 324/322 |

* cited by examiner

*Primary Examiner*—Brij Shrivastav
*Assistant Examiner*—Tiffany A. Fetzner
(74) *Attorney, Agent, or Firm*—Fletcher Yoder

(57) ABSTRACT

A method of operating a system having a coil includes providing a switched amplified current to the coil, and adding a second current to the switched amplified current, wherein the second current is substantially out of phase with the switched amplified current such that the coil receives current with substantially no switching frequency ripple.

20 Claims, 8 Drawing Sheets

METHOD/SYSTEM FOR SWITCHED FREQUENCY RIPPLE REDUCTION IN MRI GRADIENT COILS

BACKGROUND OF THE INVENTION

This invention relates to switching frequency ripples in coils, and, more particularly, to methods and apparatus, which eliminate and/or reduce a switching frequency ripple in the coil voltage and current.

Magnetic resonance imaging systems require very powerful amplifiers, typically several hundred amperes and more than 1500 volts, to drive gradient coils that provide gradient fields for the slice, frequency and phase encoding used in the imaging process. The large currents and speed desired in newer systems made conventional linear amplifiers impractical, requiring the use of switching amplifiers that have significantly reduced losses. One such amplifier is described in U.S. Pat. No. 6,031,746. One drawback of a switched amplifier is the output noise because the output is a pulsating voltage waveform pulse width modulated (PWM). The PWM output voltage results in current ripple in the gradient coils which can affect imaging quality and resolution, and large voltage variation (dv/dt) across the gradient coils can result in coupled noise to other parts of the system, which also has detrimental effects on the image quality. It is therefore desirable to reduce or eliminate such switching frequency ripples.

One difficulty to obtain a low ripple with conventional filtering is that the filter elements required would be very large and with considerable losses due to the large currents and the damping requirements. For example, if a single stage LC filter is used to reduce ripple, the attenuation desired might result in a filter bandwidth requirement that would not permit the amplifier to operate with the desired output bandwidth of several kilohertz. In addition to that, the series inductor of the LC filter should be capable of carrying several hundred amps and the damping resistor used for the capacitor will dissipate several hundred watts.

Earlier amplifiers used to drive gradient coils were linear amplifiers (Class A amplifiers) that provided a desired output current and voltage with transistors operating in their active region, thus with relatively large voltage drop. The large voltage drop together with the large output currents, several hundred amps, result in such high losses that make this approach impractical for high performance systems. Initial improvements to those linear amplifiers were to supply them with a voltage regulated according to the output voltage requirements, which attempted to reduce the voltage drop in the output stage transistors operating in the active mode (as described in U.S. Pat. Nos. 5,663,647 and 5,105,153).

The output stage losses are still quite high, and a bus regulator that is usually a high-efficiency switching regulator has problems similar to the ones for the switching amplifier. The bus regulator has to be able to provide a desired bandwidth and a very low output ripple to avoid this ripple from showing up in the output waveform. This limits the application of those approaches to reduce the ripple only when there are no large current variations, like on the top of trapezoidal current waveforms. Another approach has been to use a resonant stage before the linear output amplifier to boost the supply voltage to the amplifier only when large current transitions were required at the output (as described in U.S. Pat. Nos. 5,245,287, 5,298,863, and 5,617,030). These solutions were especially applicable when desired output waveforms have trapezoidal shape. One drawback in these approaches is that the output stage still has to correct the shape of the output waveform during the transition, because usually a sinusoidal transition is not desired, resulting in additional losses, and more importantly, they are not practical for some imaging waveforms like spirals or sinusoids that require a continuously changing voltage, because in this last case, the single resonant transition would not be usable.

One common method used for switching amplifiers is to use multiple stages of filtering to achieve the desired attenuation. This approach has two main disadvantages. First, the multiple stages introduce a large phase shift from filter input to output that makes it difficult to achieve stable tight output control with the desired high bandwidth. If multiple stage filtering is used, it is difficult to obtain a reasonable power converter bandwidth while maintaining stability due to the multiple stages of phase shifting introduced by the filters. Second, to avoid voltage ringing across capacitors in each stage the filter is damped with resistors that reduce the filter effectiveness and that are quite large because the losses reach several hundred watts in most cases.

BRIEF DESCRIPTION OF THE INVENTION

In one aspect, a method of operating a system having a coil is provided. The method including providing a switched amplified current to the coil, and adding a second current to the switched amplified current, wherein the second current is substantially out of phase with the switched amplified current such that the coil receives current with substantially no switching frequency ripple.

In another aspect, a gradient coil system is provided. The system includes at least one gradient coil including a first end and a second end, a first inductor is connected to the first end and provides a switched amplified current to the gradient coil, and a second inductor is connected to the first end and provides a second current to the gradient coil, the second current substantially out of phase with the switched amplified current such that the gradient coil receives current with substantially no switching frequency ripple.

In a further aspect, a magnetic resonance imaging (MRI) system is provided. The system includes a main magnet configured to generate a substantially uniform magnetic field, a radio frequency pulse generator configured to excite the magnetic field, a gradient coil configured to generate gradients extending in different directions in the magnetic field, the gradient coil comprising a first end and a second end, a first inductor connected to the first end and providing a switched amplified current to the gradient coil, and a second inductor connected to the first end and providing a second current to the gradient coil, the second current substantially out of phase with the switched amplified current such that the gradient coil receives current with substantially no switching frequency ripple.

DETAILED DESCRIPTION OF THE INVENTION

Herein described are methods and apparatus which eliminate and/or reduce the switching frequency ripple in an output voltage and current through a coil. The herein described methods and systems are purely passive and can be easily added to an already existing filter at an output of an amplifier. In one aspect, an auxiliary circuit includes a second winding on an output inductor filter, an auxiliary inductor, and two capacitors. The additional attenuation provided is larger than what could be achieved with the two capacitors. In an exemplary embodiment, the herein described methods and apparatus improve the performance of a switched amplifier for gradient coils in Magnetic Resonance Imaging (MRI) systems.

As used herein, an element or step recited in the singular and proceeded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features. Additionally, as is known in the art, a reference to a gradient coil contemplates a single coil and a plurality of coils, and therefore the terms gradient coil and gradient coils are used interchangeably herein.

Figure 1:
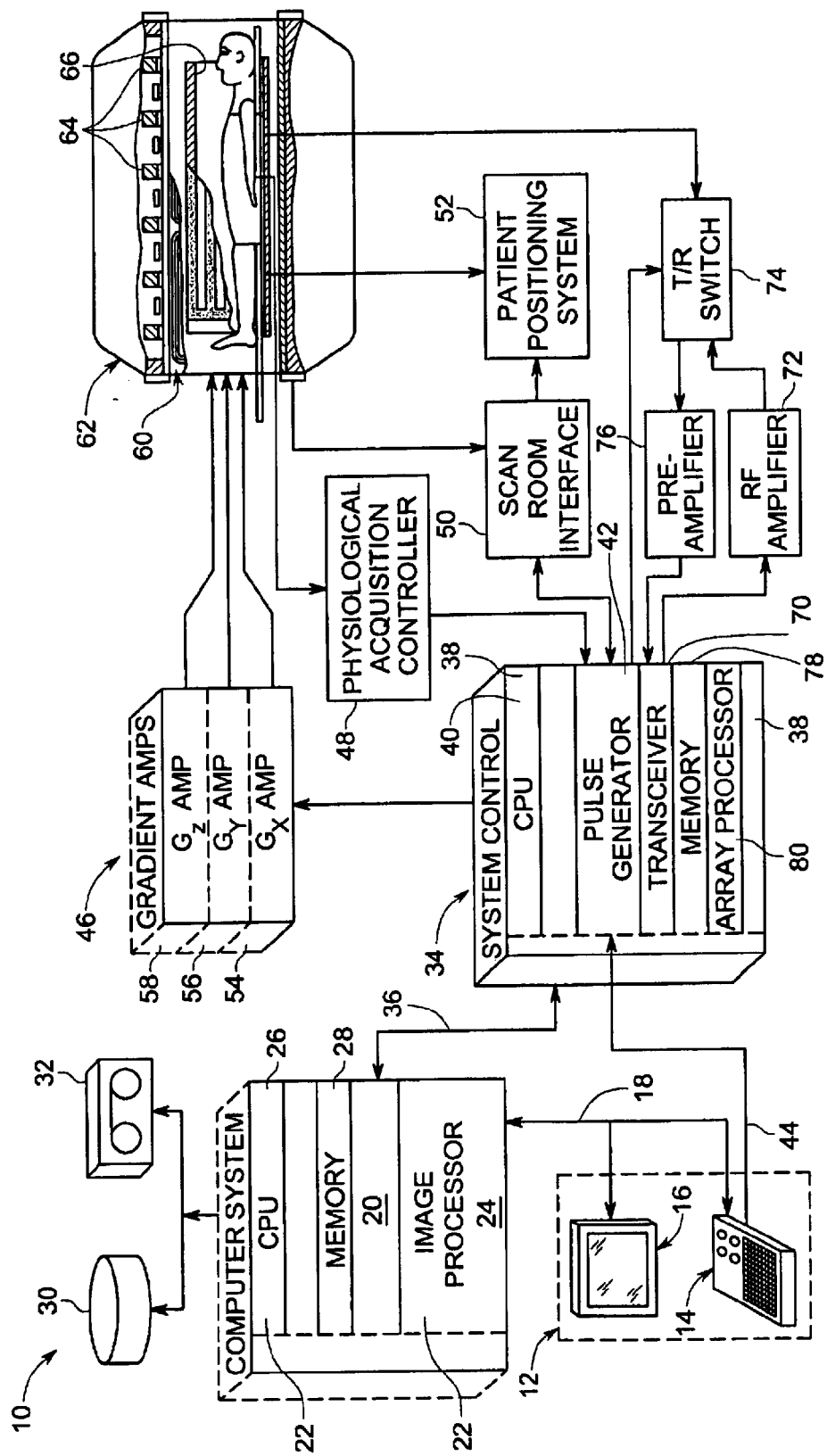
FIG. 1 is a block schematic diagram of a Magnetic Resonance Imaging (MRI) system.

FIG. 1 is a block diagram of an embodiment of a magnetic resonance imaging (MRI) system 10 in which the herein described systems and methods are implemented. MRI 10 includes an operator console 12 which includes a keyboard and control panel 14 and a display 16. Operator console 12 communicates through a link 18 with a separate computer system 20 thereby enabling an operator to control the production and display of images on screen 16. Computer system 20 includes a plurality of modules 22 which communicate with each other through a backplane. In the exemplary embodiment, modules 22 include an image processor module 24, a CPU module 26 and a memory module 28, also referred to herein as a frame buffer for storing image data arrays. Computer system 20 is linked to a disk storage 30 and a tape drive 32 to facilitate storing image data and programs. Computer system 20 is communicates with a separate system control 34 through a high speed serial link 36.

System control 34 includes a plurality of modules 38 electrically coupled using a backplane (not shown). In the exemplary embodiment, modules 38 include a CPU module 40 and a pulse generator module 42 that is electrically coupled to operator console 12 using a serial link 44. Link 44 facilitates transmitting and receiving commands between operator console 12 and system command 34 thereby allowing the operator to input a scan sequence that MRI system 10 is to perform. Pulse generator module 42 operates the system components to carry out the desired scan sequence, and generates data which indicative of the timing, strength and shape of the RF pulses which are to be produced, and the timing of and length of a data acquisition window. Pulse generator module 42 is electrically coupled to a gradient amplifier system 46 and provides gradient amplifier system 46 with a signal indicative of the timing and shape of the gradient pulses to be produced during the scan. Pulse generator module 42 is also configured to receive patient data from a physiological acquisition controller 48. In the exemplary embodiment, physiological acquisition controller 48 is configured to receive inputs from a plurality of sensors indicative of a patients physiological condition such as, but not limited to, ECG signals from electrodes attached to the patient. Pulse generator module 42 is electrically coupled to a scan room interface circuit 50 which is configured to receive signals from various sensors indicative of the patient condition and the magnet system. Scan room interface circuit 50 is also configured to transmit command signals such as, but not limited to, a command signal to move the patient to a desired position, to a patient positioning system 52.

The gradient waveforms produced by pulse generator module 42 are input to gradient amplifier system 46 that includes a $G_x$ amplifier 54, a $G_y$ amplifier 56, and a $G_z$ amplifier 58. Amplifiers 54, 56, and 58 each excite a corresponding gradient coil in gradient coil assembly 60 to generate a plurality of magnetic field gradients used for position encoding acquired signals. In the exemplary embodiment, gradient coil assembly 60 includes a magnet assembly 62 that includes a polarizing magnet 64 and a whole-body RF coil 66.

In use, a transceiver module 70 positioned in system control 34 generates a plurality of electrical pulses which are amplified by an RF amplifier 72 that is electrically coupled to RF coil 66 using a transmit/receive switch 74. The resulting signals radiated by the excited nuclei in the patient are sensed by RF coil 66 and transmitted to a preamplifier 76 through transmit/receive switch 74. The amplified NMR (nuclear magnetic resonance) signals are then demodulated, filtered, and digitized in a receiver section of transceiver 70. Transmit/receive switch 74 is controlled by a signal from pulse generator module 42 to electrically connect RF amplifier 72 to coil 66 during the transmit mode and to connect preamplifier 76 during the receive mode. Transmit/receive switch 74 also enables a separate RF coil (for example, a surface coil) to be used in either the transmit or receive mode.

The NMR signals received by RF coil 66 are digitized by transceiver module 70 and transferred to a memory module 78 in system control 34. When the scan is completed, and an array of raw k-space data has been acquired in memory module 78, the raw k-space data may rearranged into separate k-space data arrays for each cardiac phase image to be reconstructed when a cardiac exam is performed, and each of these arrays are input to an array processor 80 configured to Fourier transform the data into an array of image data. This image data is transmitted through serial link 36 to computer system 20 where it is stored in disk memory 30. In response to commands received from operator console 12, this image data may be archived on tape drive 32, or it may be further processed by image processor 24 and transmitted to operator console 12 and presented on display 16.

Figure 2:
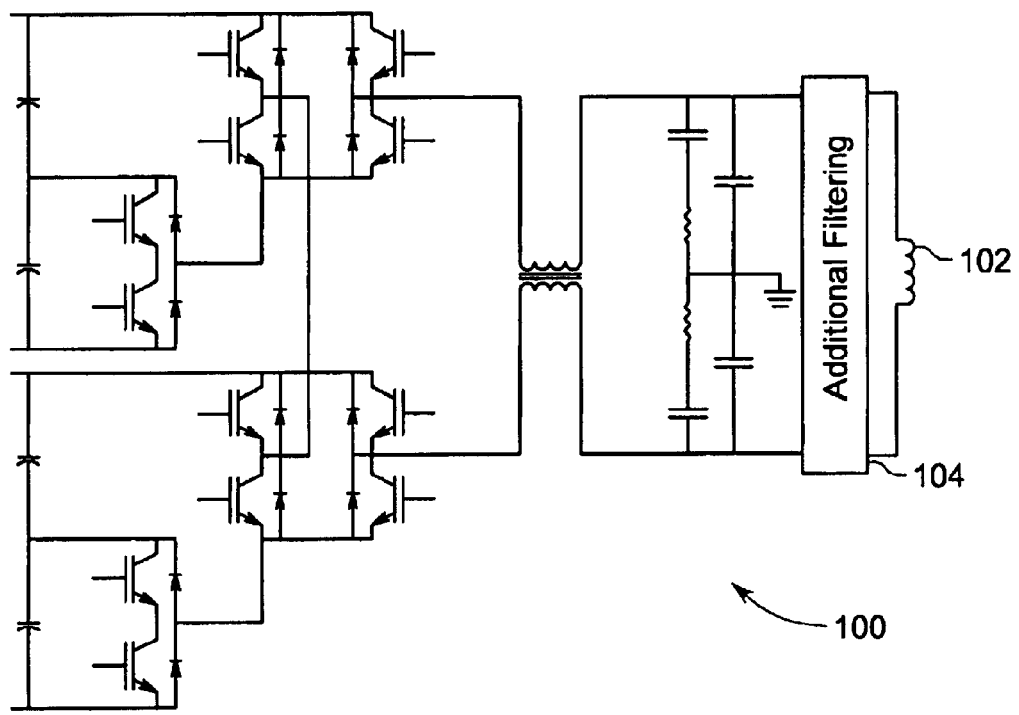
FIG. 2 illustrates a conventional circuitry of an MRI system.
Figure 3:
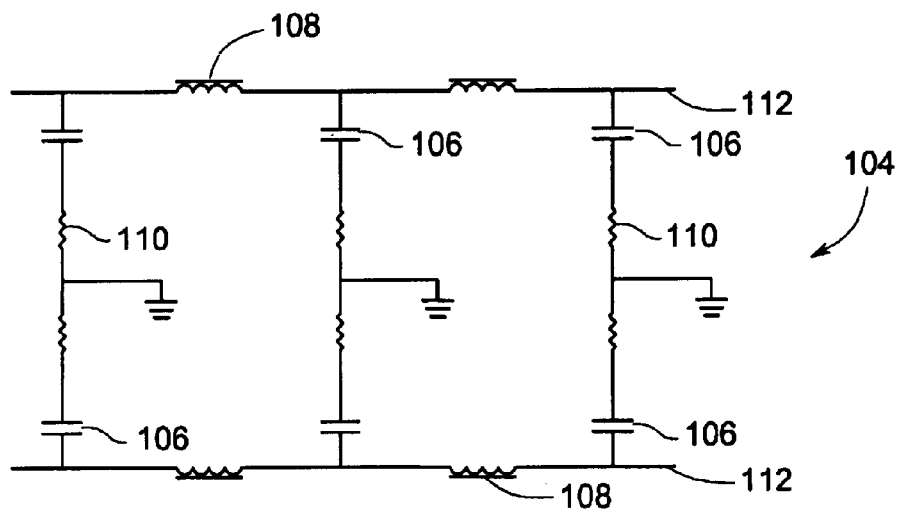
FIG. 3 illustrates the filtering module shown in FIG. 2.

FIG. 2 illustrates a conventional circuitry of an MRI system 100 including a gradient coil 102 and a filtering module 104. FIG. 3 illustrates filtering module 104 including a plurality of capacitors 106, a plurality of inductors 108, a plurality of resistors 110, and two leads 112 which are connected to coil 102 (shown in FIG. 2). In use, system 100 imparts a switching frequency ripple to coil 102.

Figure 4:
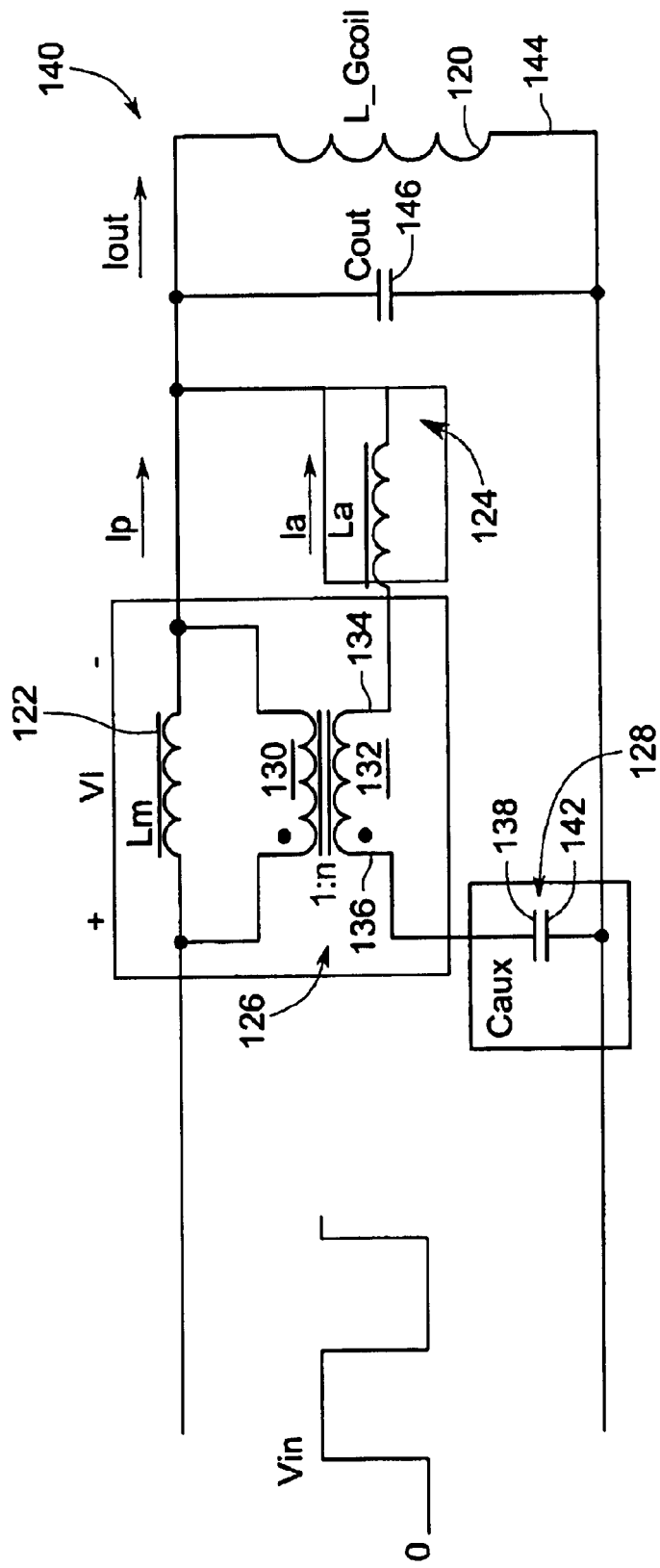
FIG. 4 illustrates a circuitry of the MRI system shown in FIG. 1.

FIG. 4 illustrates a circuitry 116 of MRI system 10 including a gradient coil 120 which is part of gradient assembly 60 (shown in FIG. 1). An inductor 122 ($L_m$ and sometimes also referred to as M herein) is positioned to receive a current from a switching amplifier (not shown), and pass the switched amplified current ($I_p$) to coil 120. The input voltage to the circuitry 116, denoted "Vin" is provided from the switching amplifier. The voltage across the inductor 122 is denoted "Vl". The switched amplified current ($I_p$) includes switching frequency ripples. A second inductor 124 ($L_a$) is coupled to inductor 122 via a transformer 126. A capacitor 128 ($C_{aux}$) is positioned between transformer 126 and coil 120. More specifically, a primary side 130 ($L_{primary}$) of transformer 126 is connected to inductor 122, and a secondary side 132 ($L_{secondary}$) of transformer 126 includes a first end 134 connected to second inductor 124 and a second end 136 of transformer 126 is connected to a first side 138 of capacitor 128. An output of inductor 124 is connected to the switched amplified current $I_p$ at a first end 140 of coil 120. A second side 142 of capacitor 128 is connected to a second end 144 of coil 120 opposite first end 140. In one embodiment, a second capacitor 146 ($C_{out}$) is connected between first end 140 and second end 144. In other words, circuit 116 adds a modified output filter inductor, by adding a secondary winding, and an additional inductor and capacitor to the circuit shown in FIG. 2. The capacitor in parallel with the output is sized such that a desired attenuation is achieved.

In use, $I_p$ contains a switching frequency ripple, $I_a$ (the current from second inductor 124) includes the same frequency ripple but at 180° out of phase with $I_p$, therefore, when $I_a$ and $I_p$ are added together, gradient coil 120 receives a current $I_{out}$ with substantially no switching frequency ripple as demonstrated below. In other words, circuit 116 operates by injecting a current $I_a$ that is equal to the ripple in current $I_p$ but with opposite sign such that the entire ripple is cancelled and $I_{out}$ is free of all switching frequency ripple.

Figure 5:
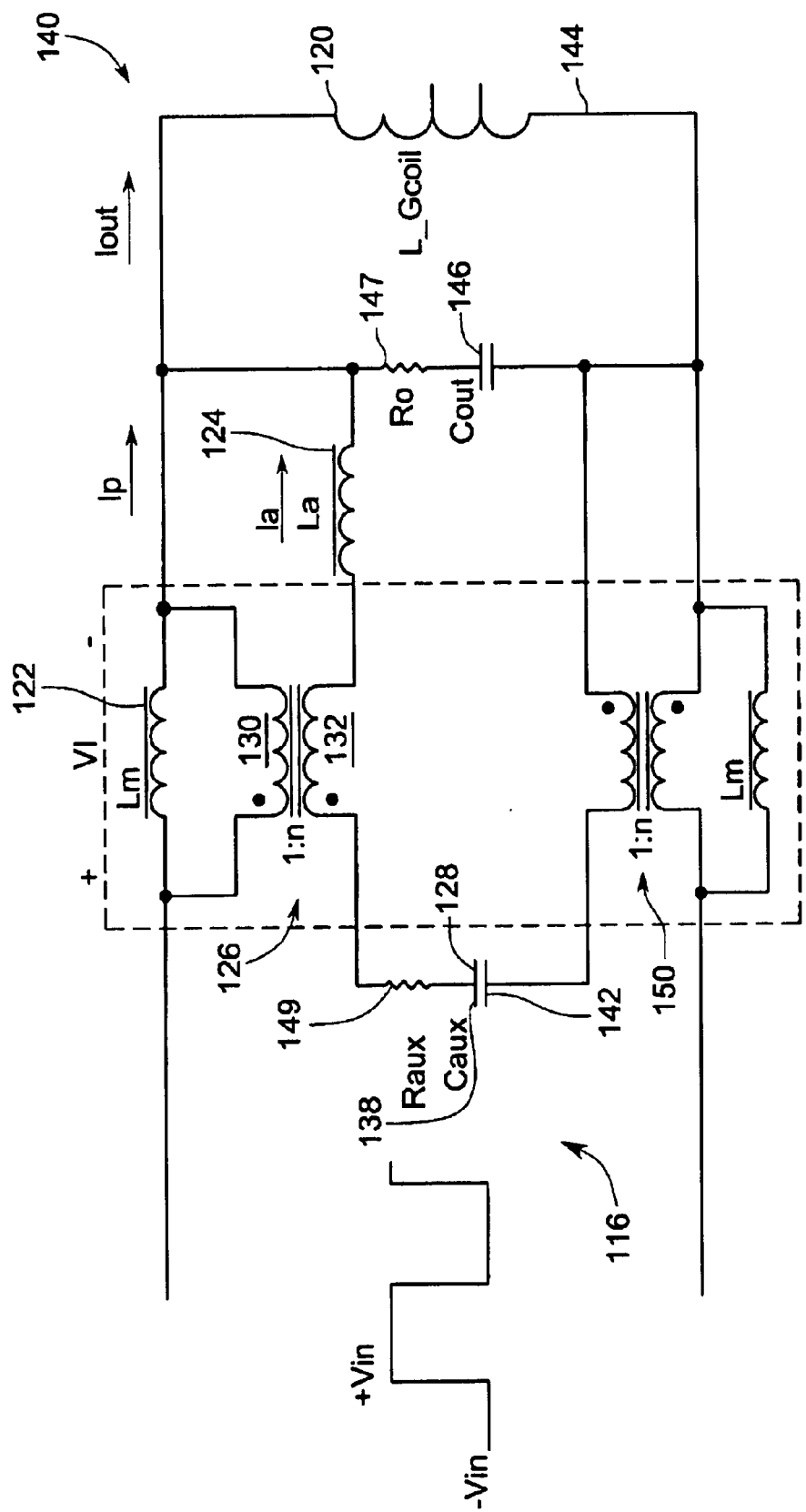
FIG. 5 illustrates an implementation of the circuit shown in FIG. 4.

FIG. 5 illustrates an implementation of circuit 116 wherein second side 142 of capacitor 128 is coupled to second end 144 of gradient coil 120 via a second transformer 150. In one embodiment, a first resistor 147 (Ro) is connected between capacitor 146 and coil 120, and a second resistor 149 (Raux) is connected between capacitor 128 and secondary side 132. In an alternative embodiment, circuit 116 includes first resistor 147 but not second resistor 149. As explained in earlier sections for the discussion of FIG. 4, Vin is the voltage input from the switched amplifier (not shown). Also, Iout and Vl are the current to the gradient coil 120 and the voltage across the inductor 122 respectively.

Figure 6:
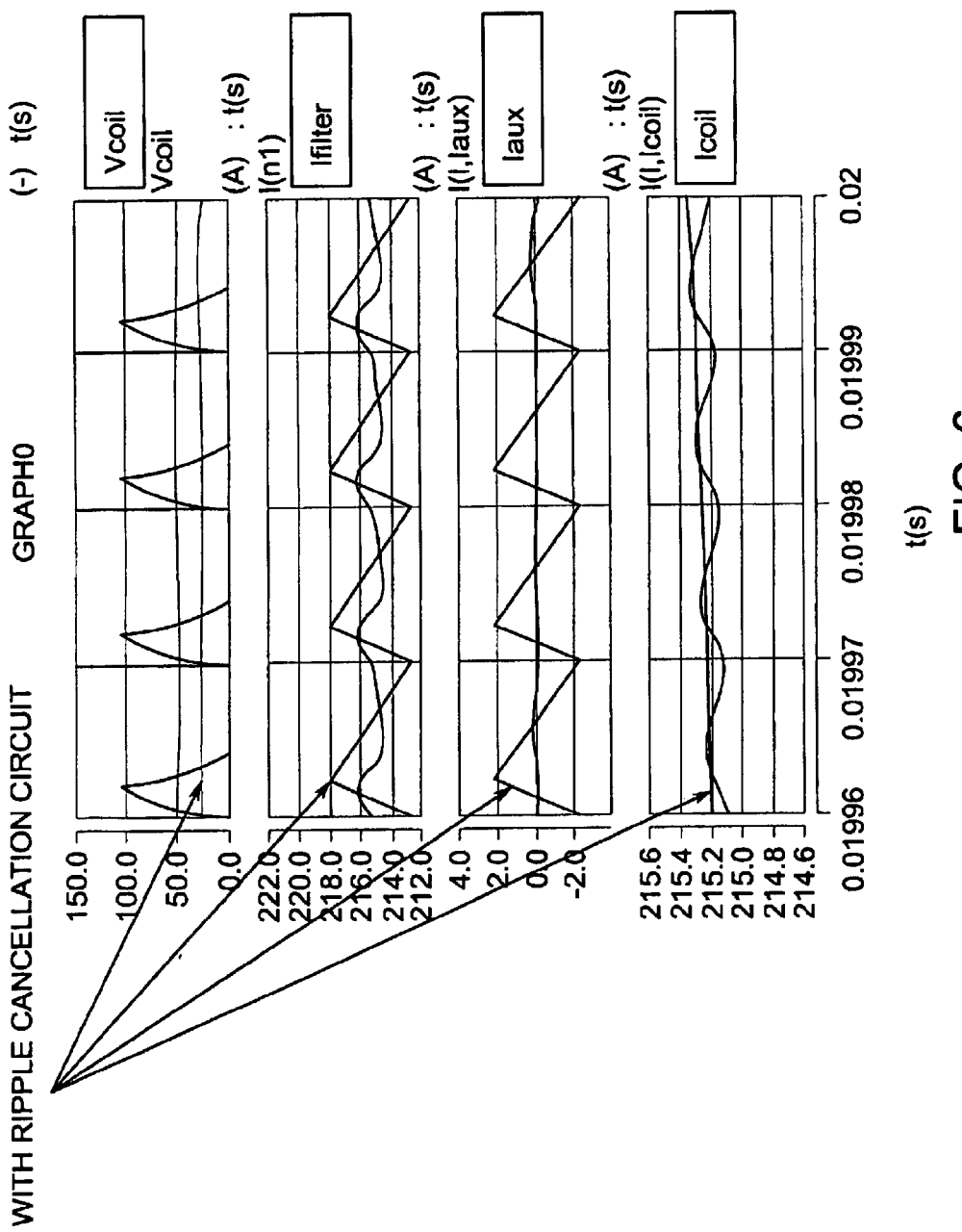
FIG. 6 illustrates waveforms obtained with a simulation comparing system using the circuit shown in FIGS. 4 and 5, with systems not using the circuit shown in FIGS. 4 and 5.

To illustrate the operation of circuit 116, FIG. 6 illustrates typical waveforms obtained from a simulation comparing systems with and without circuit 116. Looking at the waveforms in FIG. 6 it can be seen that $I_a$ is identical to the ripple in $I_p$ and the ripple in the coil current, $I_{out}$, has been eliminated. Also, looking at the voltage applied to coil 120 it is observable that the pulsating PWM voltage is now a dc voltage with a small ripple.

If circuit 116 includes a large capacitor for $C_{aux}$, then the voltage across the capacitor is a dc voltage equal to the average voltage across the load (i.e., gradient coil 120 in this example). And the ripple cancellation is achieved for any frequency and duty cycle at the output of the amplifier. In this case, the condition to achieve complete ripple cancellation is $$\frac{L_{aux}}{L_m} = \frac{n-1}{n^2} \quad (1)$$

where n is defined as $$n = \frac{N_{primary}}{N_{secondary}},$$

where $N_{primary}$ is the number of turns of primary side 130 and $N_{secondary}$ is the number of turns of secondary side 132.

However, the capacitor $C_{aux}$ may be very large for the currents and voltages in the gradient amplifier application, resulting in a reduction on the bandwidth achievable at the output. For smaller values of $C_{aux}$, a perfect ripple cancellation is still possible at a fixed frequency, if the ripple is sinusoidal by choosing the auxiliary inductor (124) to fit the following expression $$\frac{\omega^2 \cdot C_{aux} \cdot L_{aux} - 1}{\omega^2 \cdot C_{aux} \cdot L_m} = \frac{n-1}{n^2} \quad (2)$$

This approach is highly applicable for pure sinusoidal waveforms. In general, the output of the amplifier will be a square waveform with PWM duty cycle. The cancellation of only the fundamental frequency may not be enough to reduce the ripple to the required values.

One approach is to select the smallest capacitance to achieve the desired attenuation, and design the inductance in the auxiliary circuit ($L_a$ and also referred to as $L_{aux}$ herein) to meet the cancellation equation of eq. (1). One advantage of circuit 116 is that even if inductor 124 and capacitor 138 values are not perfectly chosen, some ripple cancellation is still achieved, and circuit 116 is still much better than an LC filter with the same capacitances.

The following expression illustrates how the ratio of the current through gradient coil 120 ($I_{G\_coil}$) to voltage at an input $V_{in}$ of circuit 116 provided by the amplifier $$\frac{I_{G\_coil}}{V_{in}} = \frac{1 - \frac{B}{j\omega \cdot (L_{primary} - M)}}{A - \frac{j\omega \cdot M + Z_{LC}}{j\omega \cdot (L_{primary} - M)} \cdot B} \cdot \frac{1}{1 - \omega^2 \cdot L_{G\_coil} \cdot C_{out}} \quad \text{where} \quad (3)$$

$$A = j\omega \cdot M - j\omega \cdot L_a - j\omega \cdot L_{secondary} - \frac{1}{j\omega \cdot C_{aux}} - R_L$$

$$B = j\omega \cdot L_{primary} - 2 \cdot j\omega \cdot M +$$

$$j\omega \cdot L_a + j\omega \cdot L_{secondary} + \frac{1}{j\omega \cdot C_{aux}} + R_L$$

$$Z_{LC} = \frac{j\omega \cdot L_{G\_coil}}{1 - \omega^2 \cdot L_{G\_coil} \cdot C_{out}}$$

Figure 7:
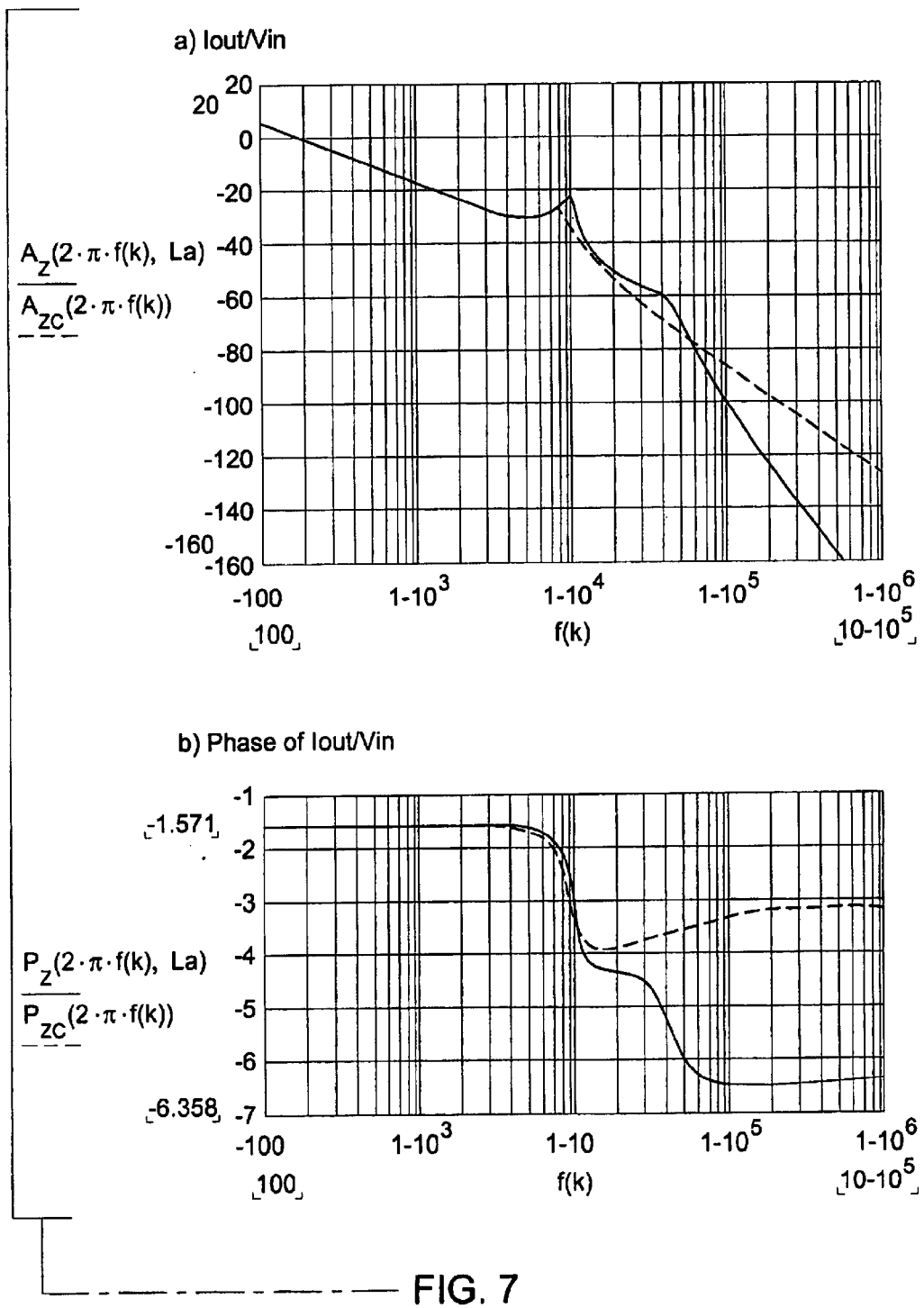
FIG. 7 illustrates a comparison between a coil current and phase with and without a presence of the circuit shown in FIGS. 4 and 5.

FIG. 7 illustrates a comparison between a coil current and phase with and without circuit 116 present. More specifically, FIG. 7a shows a comparison of the ratio $$\frac{I_{G\_coil}}{V_{in}}$$

with circuit 116 at the output of the amplifier and the case without circuit 116 with a capacitor equal to the sum of $C_{aux}$ and $C_{out}$ after the filter inductor. Looking at FIG. 7a one can see that the attenuation of circuit 116 (solid line) is superior at frequencies above 60 kHz to the attenuation without circuit 116 (broken line). FIG. 7b shows the phase shift introduced in both cases, showing that for both cases there is no significant phase difference below the first corner frequency, and the corner frequency is designed such that is higher than the control bandwidth such that the control is stable. Consequently without affecting the bandwidth and for the same capacitance value, one can achieve an almost 20 dB of additional attenuation with the same components.

Circuit 116 allows one to obtain a much higher attenuation that what one would obtain with the same capacitances in a conventional approach and the only addition is the additional winding in the inductor since in most of the cases a leakage inductor already present is used as auxiliary inductor 124. Conversely one can reduce the damping losses needed for a given attenuation level because one can achieve it with a lower capacitance.

Figure 8A:
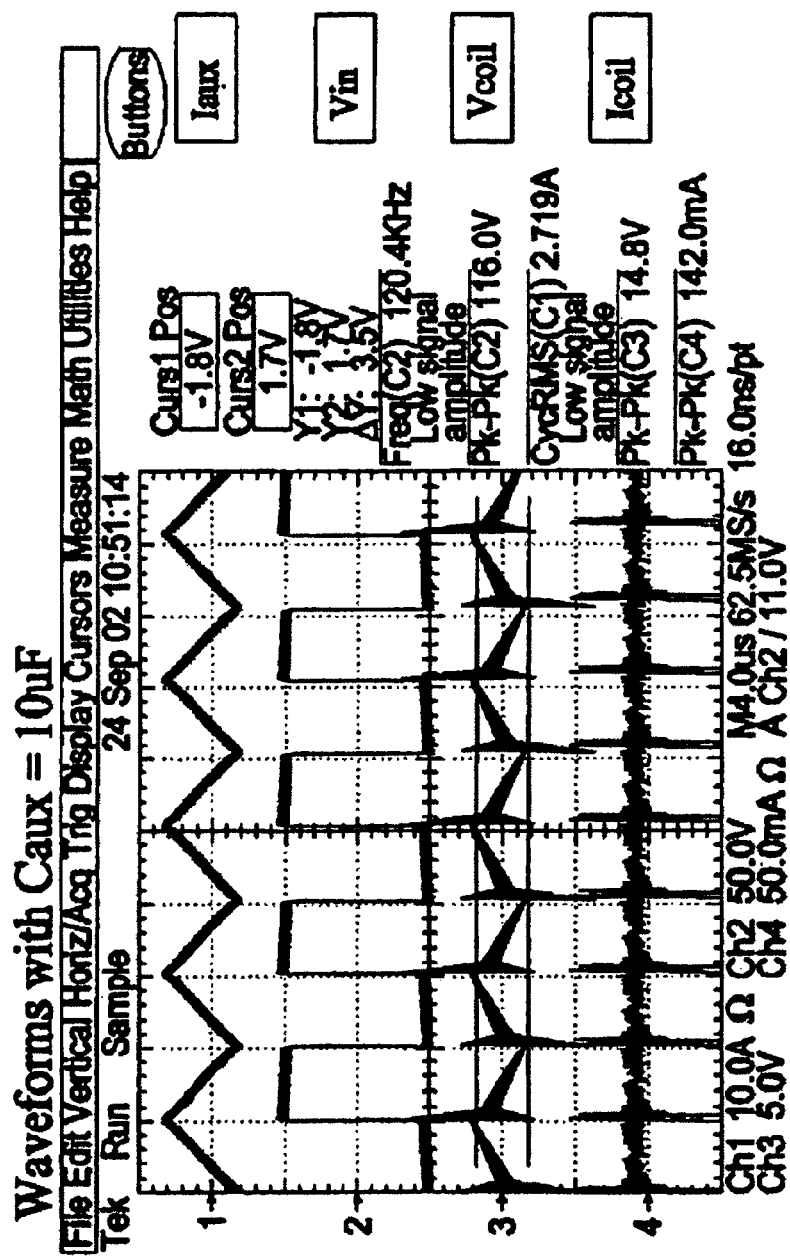
FIG. 8A illustrates waveforms with a presence of the circuit shown in FIGS. 4 and 5.
Figure 8B:
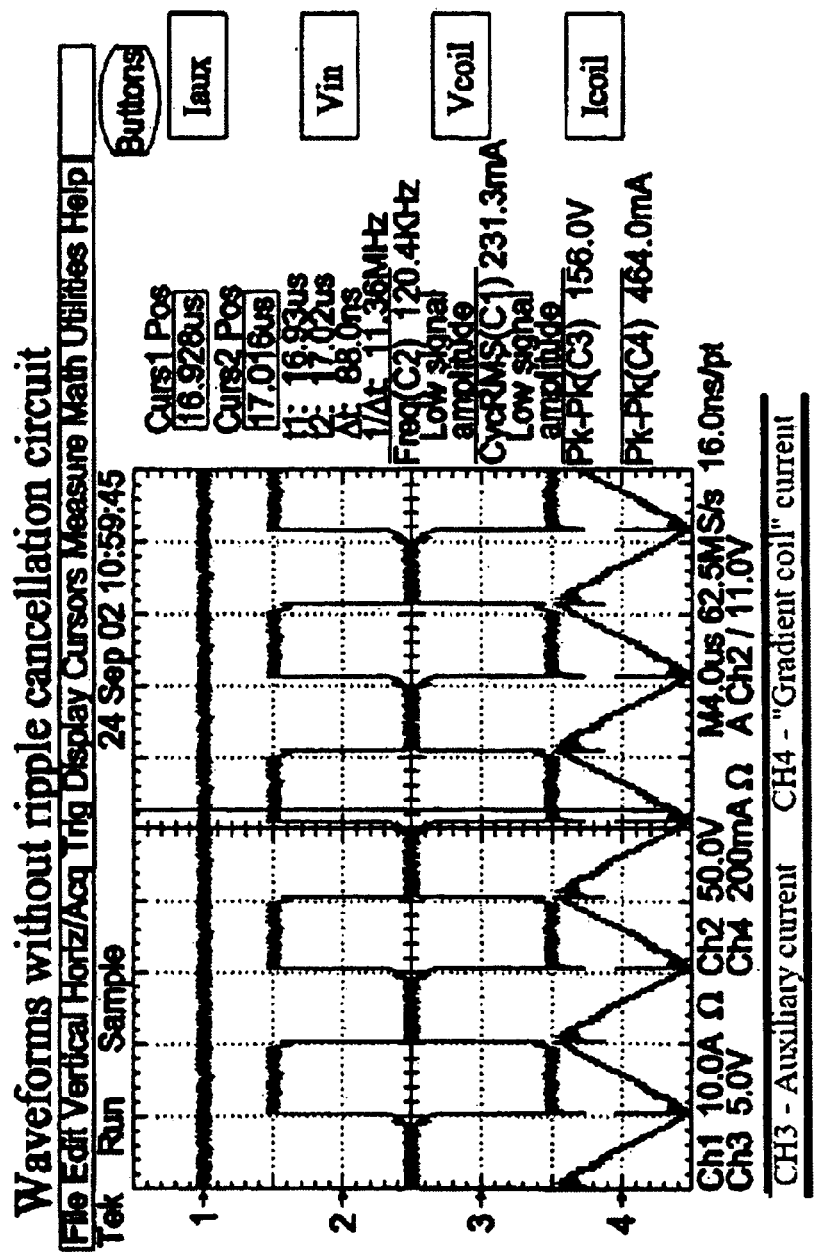
FIG. 8B illustrates waveforms without a presence of the circuit shown in FIGS. 4 and 5.

FIG. 8a illustrates waveforms with circuit 116 using a 10 μF capacitor 128 and FIG. 8b shows the waveforms without circuit 116. $I_{coil}$ (the current through coil 120) is much improved with circuit 116.

The herein described circuit added to the output of a switching amplifier eliminates the switching frequency ripple in the output voltage and current through a coil. The herein described circuit greatly improves the performance of a switched amplifier for gradient coils in Magnetic Resonance Imaging (MRI) systems. The herein described circuit is purely passive and can be easily added to an already existing filter at the output of the amplifier. The auxiliary circuit consists of a second winding on the output inductor filter an auxiliary inductor and two capacitors. The additional attenuation provided is larger than what could be achieved adding only the two capacitors. An additional feature is that the auxiliary inductor can be realized with the leakage inductance of the additional winding.

Although the above description is in reference to an MRI system, it is contemplated that the benefits of the invention accrue to applications not restricted to gradient amplifiers. For example, the herein described systems and methods apply to other type of amplifiers driving inductive loads like switched audio amplifiers driving a speaker coil.

While the invention has been described in terms of various specific embodiments, those skilled in the art will recognize that the invention can be practiced with modification within the spirit and scope of the claims.

What is claimed is:

1. A gradient coil system, comprising:
   a capacitor having a first side and a second side;
   at least one gradient coil comprising a first end and a second end;
   a first inductor connected to a first output end of a switched amplifier and connected to the first end of the gradient coil thereby providing a switched amplified current from the switched amplifier to the gradient coil;
   a second inductor connected to the first end of the gradient coil thereby providing a second current to the gradient coil, wherein the second current is substantially out of phase with the switched amplified current; and
   a transformer electrically coupling the first inductor with the second inductor, the transformer further comprising:
      a primary side and a secondary side, wherein the primary side of the transformer is connected across the first inductor and wherein the first side of the capacitor is connected to a second side of the secondary side of the transformer and the second side of the capacitor is connected to a second output end of the switched amplifier.

2. The gradient coil system in accordance with claim 1, wherein the capacitor provides ripple cancellation.

3. A method of operating a magnetic resonance imaging (MRI) system having a gradient coil, said method comprising:
   providing a switched amplified current to the gradient coil from a switched amplifier via a first inductor; and
   providing a second current to the gradient coil via a second inductor, wherein the first inductor is coupled to the second inductor via a transformer with the switched amplified current and the second current being substantially out of phase and wherein the switched amplified current and the second current are obtained from the switched amplifier.

4. A method in accordance with claim 3 further comprising coupling the first inductor with the second inductor via a transformer wherein the second inductor is connected to a first end of a secondary side of the transformer and a first side of a capacitor is connected to a second end of the secondary side of the transformer.

5. A method in accordance with claim 4 further comprising connecting a second side of the capacitor to an end of the gradient coil opposite the first inductor and second inductor.

6. A method in accordance with claim 5 further comprising connecting a second capacitor between the first inductor and second inductor and the end of the gradient coil opposite the first inductor and second inductor.

7. A method in accordance with claim 4 further comprising:
   connecting a first inductor to the gradient coil such that the switched amplified current is received from the first inductor, wherein the first inductor has an inductance $L_p$; and
   connecting a second inductor to the gradient coil such that the second current is received from the second inductor, wherein the second inductor has an inductance $L_{aux}$, wherein $L_{aux}/L_p=(n-1)/n^2$, where n is a number of primary turns of the transformer divided by a number of secondary turns of the transformer.

8. A method in accordance with claim 6 further comprising:
   connecting a first inductor to the gradient coil such that the switched amplified current is received from the first inductor, wherein the first inductor has an inductance $L_p$; and
   connecting a second inductor to the gradient coil such that the second current is received from the second inductor, wherein the second inductor has an inductance $L_{aux}$, wherein $[(\omega^2)(C_{aux})(L_{aux})-1]/[(\omega^2)(C_{aux})(L_p)]=(n-1)/n^2$, where n is a number of primary turns of the transformer divided by a number of secondary turns of the transformer, $C_{aux}$ is a capacitance of the capacitor connected to the second end of the secondary side, and ω is an angular frequency.

9. A gradient coil system comprising:
   at least one gradient coil comprising a first end and a second end;
   a first inductor connected to said first end and providing a switched amplified current to said gradient coil;
   a second inductor connected to said first end and providing a second current to said gradient coil, the second current substantially out of phase with the switched amplified current such that said gradient coil receives current with substantially no switching frequency ripple; and a transformer coupling the first inductor with the second inductor.

10. A system in accordance with claim 9, wherein the second inductor is connected to a first end of a secondary side of the transformer, said system further comprising a capacitor wherein a first side of said capacitor is connected to a second end of the secondary side of the transformer.

11. A system in accordance with claim 10, wherein a second side of the capacitor is connected to said second end of said gradient coil.

12. A system in accordance with claim 11 further comprising a second capacitor connected between said first end of said gradient coil and said second end of said gradient coil.

13. A system in accordance with claim 9, wherein said first inductor has an inductance $L_p$, said second inductor has an inductance Laux, and wherein Laux/Lp=(n−1)/n2, where n is a number of primary turns of the transformer divided by a number of secondary turns of the transformer.

14. A system in accordance with claim 12, wherein said first inductor has an inductance Lp, said second inductor has an inductance Laux, and wherein $$\frac{\omega^2 \cdot C_{aux} \cdot L_{aux} - 1}{\omega^2 \cdot C_{aux} \cdot L_p} = \frac{n-1}{n^2},$$

where n is a number of primary turns of the transformer divided by a number of secondary turns of said transformer, Caux is a capacitance of said capacitor connected to said second end of said secondary side, and ω is an angular frequency.

15. A magnetic resonance imaging (MRI) system comprising:
- a main magnet configured to generate a substantially uniform magnetic field;
- a radio frequency pulse generator configured to excite the magnetic field;
- a gradient coil configured to generate gradients extending in different directions in the magnetic field, said gradient coil comprising a first end and a second end;
- a first inductor connected to said first end and providing a switched amplified current to said gradient coil;
- a second inductor connected to said first end and providing a second current to said gradient coil, the second current substantially out of phase with the switched amplified current such that said gradient coil receives current with substantially no switching frequency ripple; and
- a transformer coupling the first inductor with the second inductor.

16. A system in accordance with claim 15, wherein the second inductor is connected to a first end of a secondary side of the transformer, said system further comprising a capacitor wherein a first side of said capacitor is connected to a second end of the secondary side of the transformer.

17. A system in accordance with claim 15 wherein said first inductor has an inductance Lp, said second inductor has an inductance Laux, and wherein Laux/Lp=(n−1)/n2, where n is a number of primary turns of the transformer divided by a number of secondary turns of the transformer.

18. A system in accordance with claim 16, wherein a second side of the capacitor is connected to said second end of said gradient coil.

19. A system in accordance with claim 18 further comprising a second capacitor connected between said first end of said gradient coil and said second end of said gradient coil.

20. A system in accordance with claim 19 wherein said first inductor has an inductance Lp, said second inductor has an inductance Laux, and wherein $$\frac{\omega^2 \cdot C_{aux} \cdot L_{aux} - 1}{\omega^2 \cdot C_{aux} \cdot L_p} = \frac{n-1}{n^2},$$

where n is a number of primary turns of the transformer divided by a number of secondary turns of said transformer, Caux is a capacitance of said capacitor connected to said second end of said secondary side, and ω is an angular frequency.

* * * * *